(12) United States Patent
Chiou et al.

(10) Patent No.: US 11,211,310 B1
(45) Date of Patent: Dec. 28, 2021

(54) PACKAGE STRUCTURES

(71) Applicant: Delta Electronics, Inc., Taoyuan (TW)

(72) Inventors: Sheng-Che Chiou, Taoyuan (TW); Jen-Chih Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/011,251

(22) Filed: Sep. 3, 2020

(51) Int. Cl.
*H01L 23/495* (2006.01)
*H01L 23/34* (2006.01)
*H01L 23/48* (2006.01)
*H01L 23/28* (2006.01)
*H05K 7/20* (2006.01)
*H05K 7/18* (2006.01)
*H01L 23/31* (2006.01)
*H01L 23/00* (2006.01)
*H01L 23/29* (2006.01)

(52) U.S. Cl.
CPC ......... *H01L 23/4951* (2013.01); *H01L 23/29* (2013.01); *H01L 23/3107* (2013.01); *H01L 23/3114* (2013.01); *H01L 23/49524* (2013.01); *H01L 23/49562* (2013.01); *H01L 23/49568* (2013.01); *H01L 23/49575* (2013.01); *H01L 23/49582* (2013.01); *H01L 24/16* (2013.01); *H01L 24/40* (2013.01); *H01L 24/48* (2013.01); *H01L 24/73* (2013.01); *H01L 2224/16245* (2013.01); *H01L 2224/40245* (2013.01); *H01L 2224/73255* (2013.01); *H01L 2924/1033* (2013.01); *H01L 2924/13064* (2013.01)

(58) Field of Classification Search
CPC ......... H01L 24/16; H01L 24/40; H01L 24/73; H01L 24/48; H01L 24/29; H01L 24/83; H01L 25/84; H01L 24/81; H01L 23/4951; H01L 23/3114; H01L 23/49524; H01L 23/49562; H01L 23/49568; H01L 23/49582; H01L 23/49575; H01L 23/3107
See application file for complete search history.

(56) References Cited

U.S. PATENT DOCUMENTS 7,541,681 B2 * 6/2009 Otremba ............. H01L 23/3107 257/778
8,564,110 B2 * 10/2013 Xue ........................ H01L 24/92 257/676

(Continued)

*Primary Examiner* — Alonzo Chambliss
(74) *Attorney, Agent, or Firm* — Muncy, Geissler, Olds and Lowe, P.C.

(57) ABSTRACT

A package structure is provided. The package structure includes a leadframe, a device, first protrusions, second protrusions, a conductive unit, and an encapsulation material. The device includes a substrate, an active layer, first electrodes, second electrodes and a third electrode. The first electrodes have different potentials than the second electrodes. The first electrodes and the second electrodes are arranged so that they alternate with each other. The first protrusions are disposed on each of the first electrodes. The second protrusions are disposed on each of the second electrodes. The first protrusions and the second protrusions are connected to the leadframe. The first side of the conductive unit is connected to the substrate of the device. The conductive unit is connected to the leadframe. The encapsulation material covers the device and the leadframe. The second side of the conductive unit is exposed from the encapsulation material.

19 Claims, 5 Drawing Sheets

(56) References Cited

U.S. PATENT DOCUMENTS

| | | | |
|---|---|---|---|
| 2002/0027276 A1* | 3/2002 | Sakamoto | H01L 21/4821 |
| | | | 257/690 |
| 2004/0217474 A1* | 11/2004 | Kajiwara | H01L 23/495 |
| | | | 257/734 |
| 2012/0217556 A1* | 8/2012 | Kajiwara | H01L 23/3107 |
| | | | 257/288 |
| 2013/0264696 A1* | 10/2013 | Kajiwara | H01L 23/49548 |
| | | | 257/676 |
| 2014/0117523 A1* | 5/2014 | Ho | H01L 23/4952 |
| | | | 257/676 |
| 2015/0325559 A1* | 11/2015 | Niu | H01L 23/49568 |
| | | | 257/675 |
| 2016/0093560 A1* | 3/2016 | Huo | H01L 24/97 |
| | | | 257/676 |

* cited by examiner

PACKAGE STRUCTURES

BACKGROUND OF THE INVENTION

Field of the Invention

The invention relates to a package structure, and more particularly to a package structure with plural protrusions of different polarities which are arranged in such a way that they alternate with one another and are disposed between the leadframe and the device.

Description of the Related Art

Flip chip packaging describes a method of electrically connecting a die to a package carrier. The package carrier, either a substrate or a leadframe, then provides a connection from the die to the exterior of the package. In "standard" packaging, the interconnection between the die and the carrier is made using wires. The die is attached face-up to the carrier, and then the wires are bonded first to the die, then looped and bonded to the carrier. The wires are typically 1-5 mm in length, and 15-35 μm in diameter.

In contrast, the interconnection between the die and the carrier in the flip chip packaging is made through conductive bumps that are placed directly on the die surface. The bumped die is then flipped over and placed face-down, with the bumps connecting directly to the carrier. A bump is typically 60-100 μm high, and 80-125 μm in diameter. The flip chip connection is generally formed in one of two ways: using solder or using conductive adhesive.

Using the flip chip interconnection offers a number of possible advantages to the user: signal inductance is reduced, because the interconnection is much shorter in length (0.1 mm vs 1-5 mm), and the inductance of the signal path is greatly reduced. This is a key factor in high-speed communication and switching devices; power/ground inductance is reduced using the flip chip interconnection, and power can be brought directly into the core of the die, rather than having to be routed to the edges. This greatly decreases the noise of the core power, improving performance of the silicon; signal density is high, as the entire surface of the die can be used for interconnection, rather than just the edges. This is similar to the comparison between QFP and BGA packages, because the flip chip can connect over the surface of the die, it can support a vastly larger number of interconnections on the same die size; and the die is shrunk. For a pad-limited die (a die whose size is determined by the edge space required for bond pads), the size of the die can be reduced, saving on silicon cost. However, there is insufficient distance between the die and the carrier due to the die connecting directly to the carrier merely through the conductive bumps, resulting in reduced breakdown voltage.

Additionally, in contrast to the traditional method of die attachment by wire bonding, high-power packages and discrete devices such as metal oxide semiconductor field effect transistors (MOSFETs), insulated gate bipolar transistors (IGBTs), and switched output differential structure (SODs) use a copper clip to connect the die to a basic substrate and/or a leadframe. A clip bonding technology replaces the standard wire-bond connection between the die and the leadframe by a solid copper bridge.

However, the solid copper bridge (i.e. a copper clip) used in the clip bonding package is also encapsulated by an encapsulation material such that the heat dissipation effect of the encapsulated copper clip is reduced.

Therefore, the development of a package structure which is formed using a flip chip and clip bonding technologies capable of improving breakdown voltage and heat dissipation effect is desirable.

BRIEF SUMMARY OF THE INVENTION

One embodiment of the invention provides a package structure. The package structure includes a leadframe, a device, a plurality of first protrusions, a plurality of second protrusions, a conductive unit, and an encapsulation material. The device includes a substrate, an active layer, a plurality of first electrodes, a plurality of second electrodes and a third electrode. The active layer is disposed on the substrate. The first electrodes, the second electrodes and the third electrode are disposed on the active layer. The first electrodes have different potentials than the second electrodes. The first electrodes and the second electrodes are arranged in such a way that they alternate with one another. The first protrusions are disposed on each of the first electrodes. The second protrusions are disposed on each of the second electrodes. The first protrusions and the second protrusions are connected to the leadframe. The first portion of the conductive unit is connected to the substrate of the device. The second portion of the conductive unit is connected to the leadframe. The encapsulation material covers the device and the leadframe. A part of the topmost surface of the conductive unit is exposed from the encapsulation material.

In some embodiments, the device includes a lateral power component. In some embodiments, the first electrodes include source electrodes, the second electrodes include drain electrodes, and the third electrode includes a gate electrode.

In some embodiments, the first protrusions and the second protrusions include copper, tin, gold, or a combination thereof. In some embodiments, the first protrusions and the second protrusions include cylinders. In some embodiments, the first protrusions and the second protrusions have a diameter which is at least 65 μm. In some embodiments, the first protrusions have a first spacing which is at least 40 μm. In some embodiments, the second protrusions have the same spacing as that of the first protrusions. In some embodiments, the first spacing is smaller than or equal to the diameter of the first protrusions and the second protrusions. In some embodiments, the first protrusion and the second protrusion have a second spacing which is at least 65 μm. In some embodiments, the second spacing is greater than or equal to 1.6 times the first spacing.

In some embodiments, the conductive unit includes copper. In some embodiments, the conductive unit includes a clip. In some embodiments, the substrate of the device has a first surface area, the part of the topmost surface of the conductive unit exposed from the encapsulation material has a second surface area, and the second surface area is greater than or equal to 1.2 times the first surface area.

In some embodiments, the package structure further includes a plurality of metal pads disposed between the leadframe and the first protrusions and the second protrusions. In some embodiments, the metal pads include copper, silver, gold, or tin. In some embodiments, the metal pads have a width which is smaller than or equal to the diameter of the first protrusions and the second protrusions.

In some embodiments, the leadframe and the device have a third spacing which is at least 60 μm.

In some embodiments, the package structure further includes a patterned passivation layer covering the active layer and a part of the first electrodes and the second electrodes. In some embodiments, the package structure further includes a patterned polymer layer covering the patterned passivation layer and a part of the first electrodes and the second electrodes, and a plurality of openings are exposed. In some embodiments, the package structure further includes a plurality of metal layers disposed on sidewalls and bottoms of the openings. In some embodiments, the first protrusions and the second protrusions are connected to the first electrodes and the second electrodes through the metal layers.

In one embodiment of the present invention, the power component is disposed on the leadframe through the multiple protrusions (i.e. copper pillars) connecting to the source electrodes and the drain electrodes using a flip chip technology. The source electrodes (the first protrusions) with low potentials and the drain electrodes (the second protrusions) with high potentials are arranged in such a way that they alternate with one another. The spacing between the protrusions with different polarities disposed on different electrodes is greater than or equal to about 1.6 times the spacing between the protrusions with the same polarity disposed on the same electrode. The arrangement and dimensions of the components have the following advantages. A narrow spacing between the adjacent protrusions is obtained. The influence of parasitic inductance is reduced due to replacement of the conventional wire bonding connection. The breakdown voltage is improved due to increase in the distance (at least 60 μm or more) between the power component and the leadframe by the protrusions with a proper height. The package products have excellent reliability.

In the lateral power component where the source electrodes and the drain electrodes are on the same side of the semiconductor substrate, current flows from the high-potential drain electrodes to the low-potential source electrodes through the active layer without flowing through the semiconductor substrate which is capable of avoiding parasitic resistance and inductance produced by the semiconductor substrate while operating. Additionally, the conductive unit (i.e. clip) is extended from the semiconductor substrate to the leadframe, replacing conventional wire bonding requiring two wires extended from both ends of the semiconductor substrate to the leadframe, which is capable of effectively reducing the entire package size.

Furthermore, the package structure with the exposed conductive unit (i.e. the package structure with at least a portion of the conductive unit uncovered by the encapsulation material, for example, the surface area of the exposed side of the conductive unit is greater than or equal to about 1.2 times the back surface area of the substrate of the device) is capable of achieving a good bi-directional heat dissipation effect, and improving device performance.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
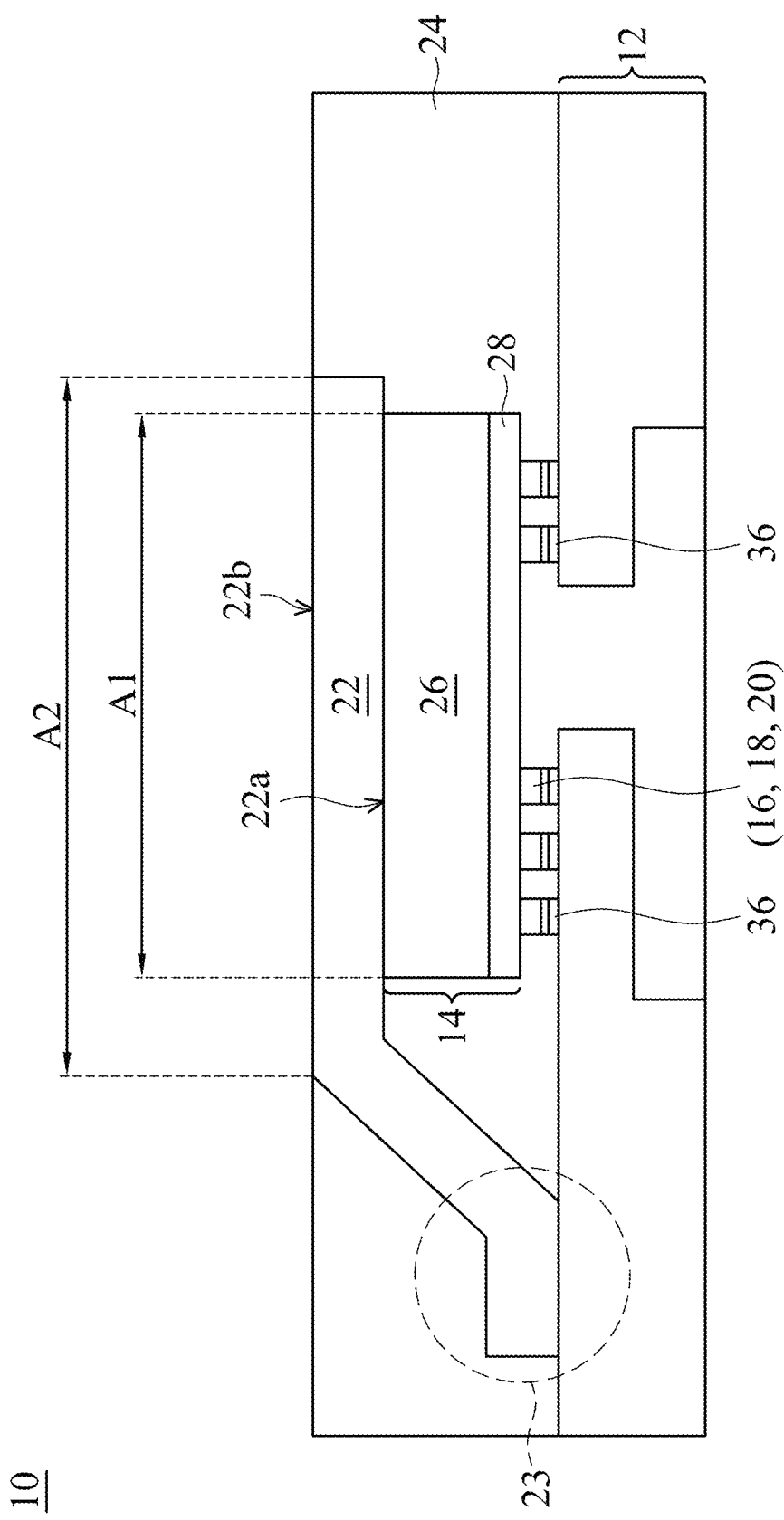
FIG. 1 is a cross-sectional view of a package structure in accordance with one embodiment of the invention.
Figure 2:
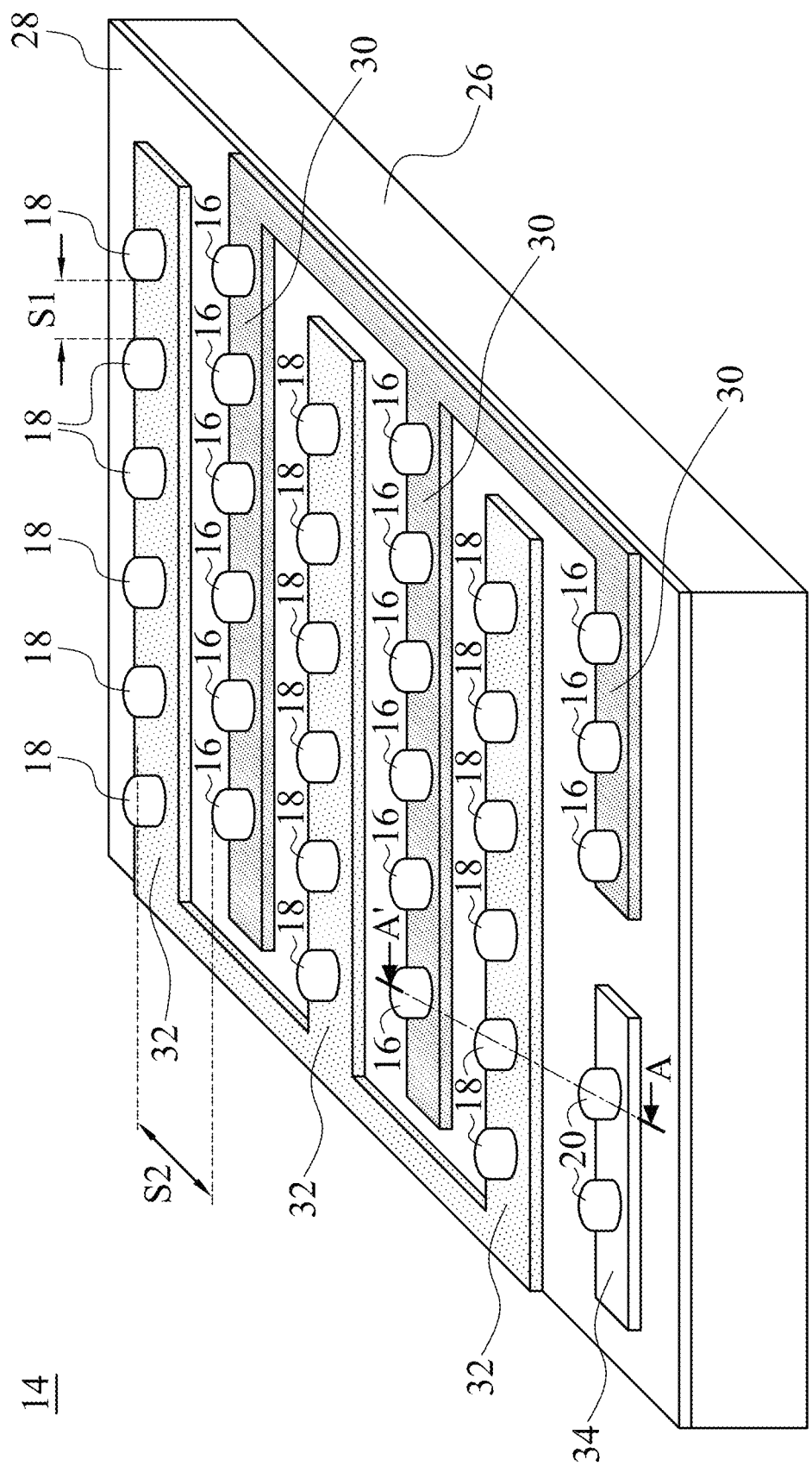
FIG. 2 is a top view of a part of a package structure in accordance with one embodiment of the invention.
Figure 3:
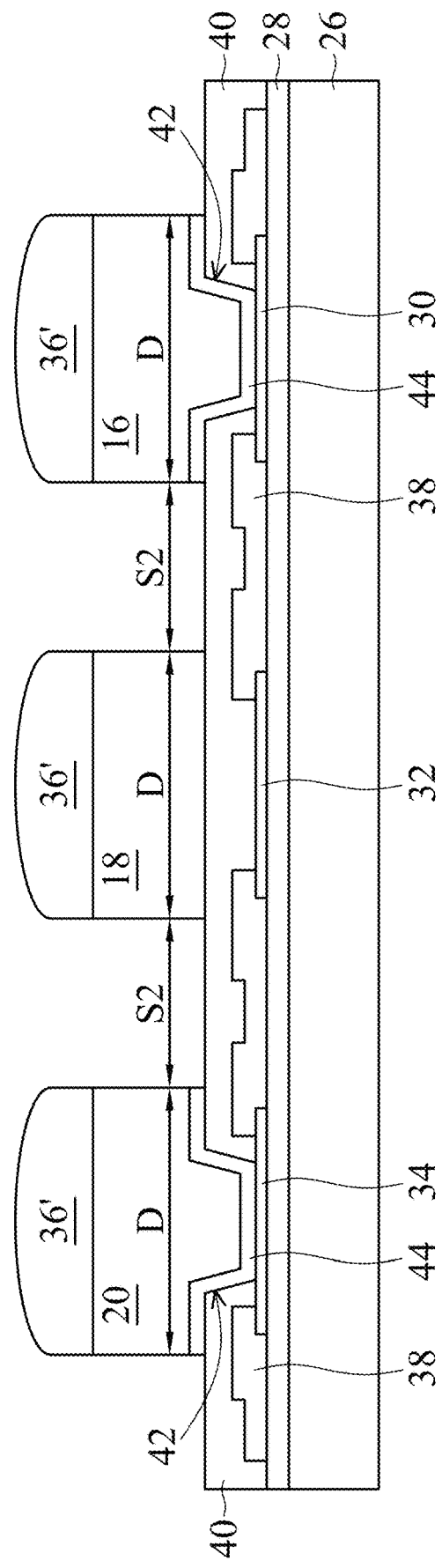
FIG. 3 is a cross-sectional view of a part of a package structure in accordance with one embodiment of the invention.
Figure 4:
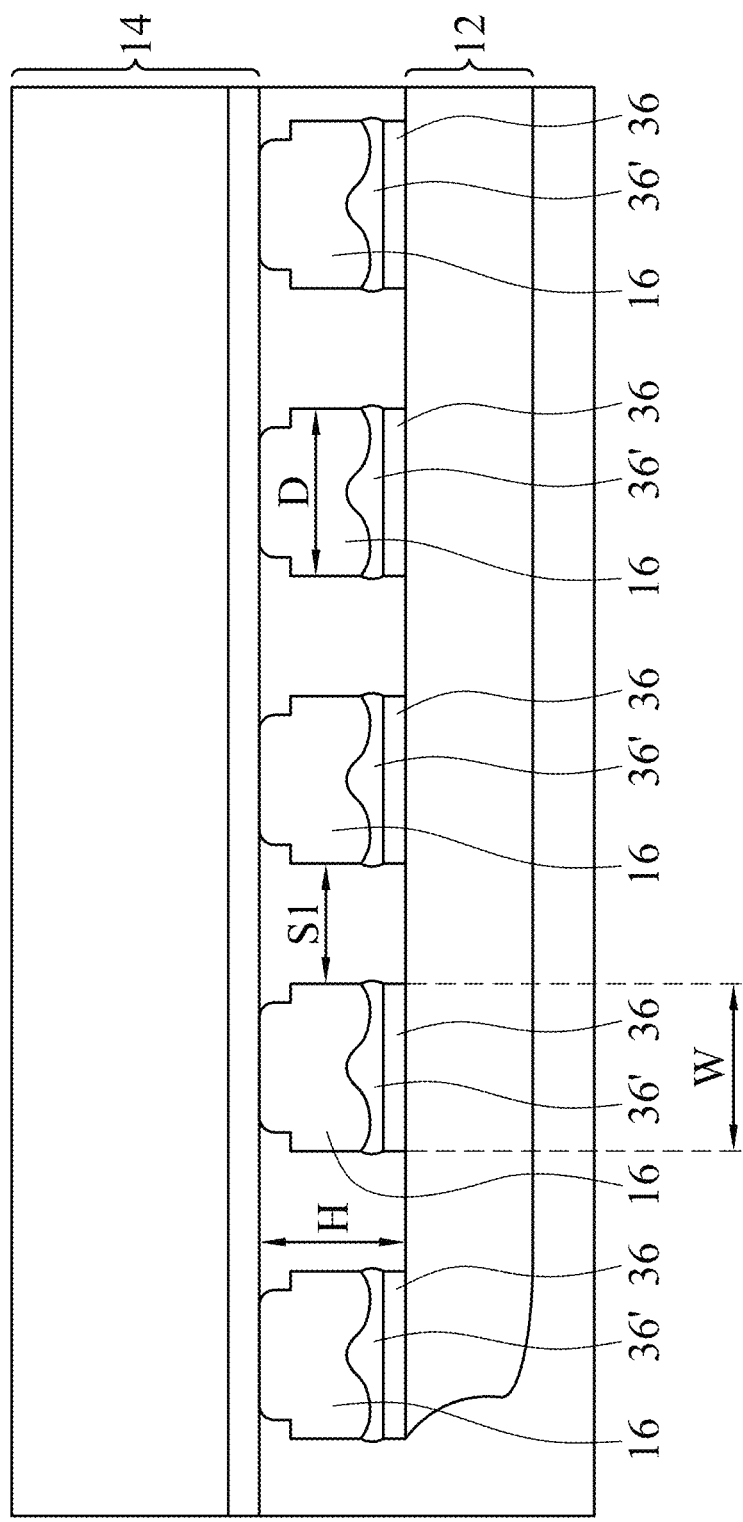
FIG. 4 is a cross-sectional view of a part of a package structure in accordance with one embodiment of the invention.
Figure 5:
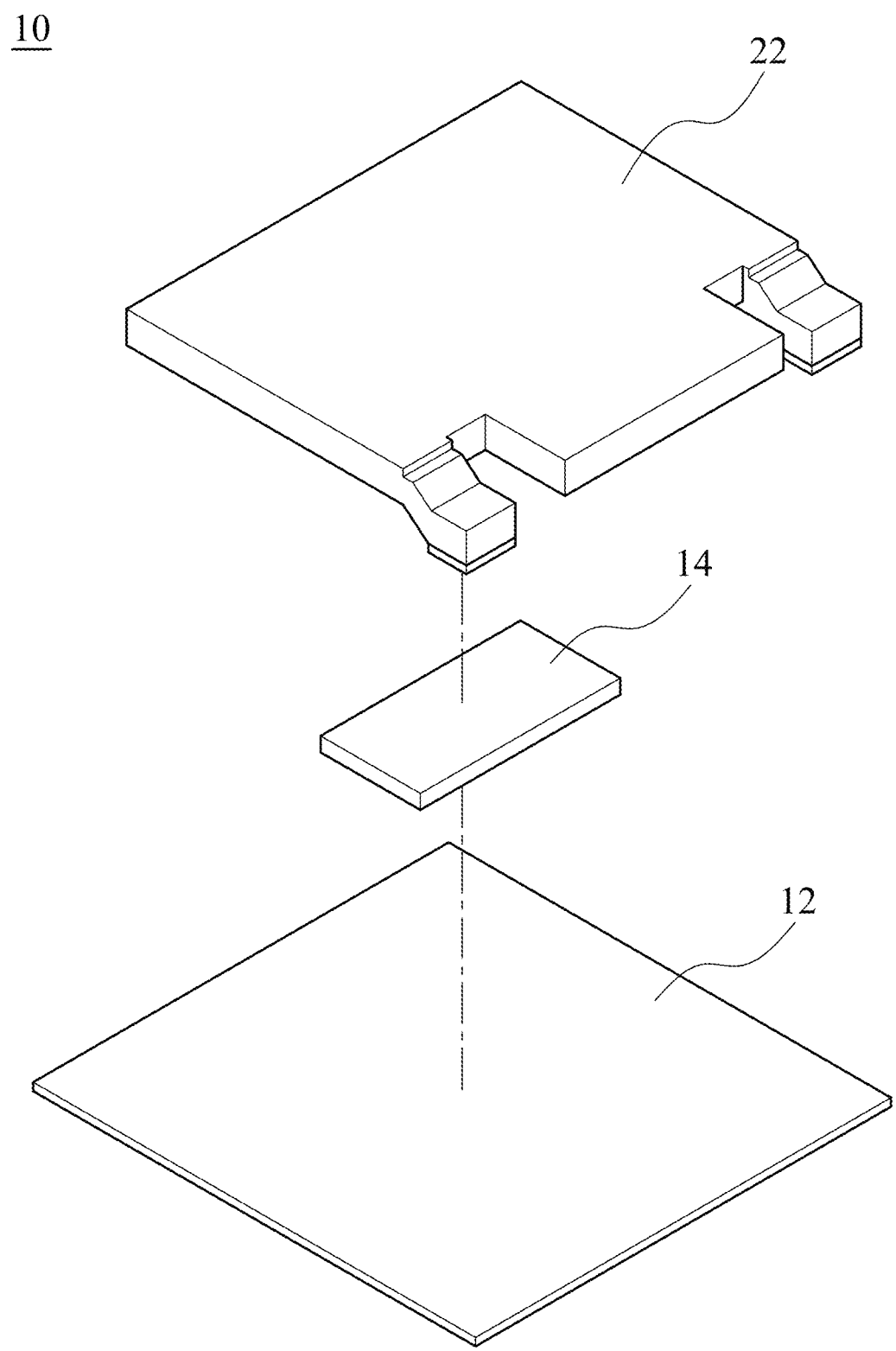
FIG. 5 is an exploded view of a package structure in accordance with one embodiment of the invention.

Referring to FIGS. 1-5, in accordance with one embodiment of the invention, a package structure 10 is provided. FIG. 1 is a cross-sectional view of the package structure 10. FIG. 2 is a top view of a part of the package structure 10. FIG. 3 is a cross-sectional view of a part of the package structure 10 obtained along cross-sectional line A-A' of FIG. 2. FIG. 4 is a partial enlarged view of FIG. 1. FIG. 5 is an exploded view of the package structure 10.

As shown in FIG. 1, the package structure 10 includes a leadframe 12, a device 14, a plurality of first protrusions 16, a plurality of second protrusions 18, a plurality of third protrusions 20, a conductive unit 22, and an encapsulation material 24. A more detailed structure of the device 14 is disclosed in FIGS. 2 and 3. The device 14 includes a substrate 26, an active layer 28, a plurality of first electrodes 30, a plurality of second electrodes 32 and a third electrode 34. The active layer 28 is disposed on the substrate 26. The first electrodes 30, the second electrodes 32 and the third electrode 34 are disposed on the active layer 28. In this embodiment, the first electrodes 30, the second electrodes 32 and the third electrode 34 include strip electrodes. In other embodiments, the first electrodes 30, the second electrodes 32 and the third electrode 34 include other suitable shapes for the subsequent arrangement of multiple protrusions. The "strip electrode" means that the electrode extends from one side of the substrate 26 to the position that is adjacent to the opposite side of the substrate 26. The first electrodes 30 have different potentials than the second electrodes 32. For example, the first electrodes 30 are low potentials, and the second electrodes 32 are high potentials. Specifically, the first electrodes 30 with low potentials and the second electrodes 32 with high potentials are arranged in such a way that they alternate with one another. That is, one first electrode 30 with low potential, one second electrode 32 with high potential, another first electrode 30 with low potential, another second electrode 32 with high potential, and etc. are alternately arranged on the active layer 28. The first protrusions 16 are disposed on each of the first electrodes 30 to form a row of the first protrusions 16 disposed on each of the strip first electrodes 30. The second protrusions 18 are disposed on each of the second electrodes 32 to form a row of the second protrusions 18 disposed on each of the strip second electrodes 32. The third protrusions 20 are disposed on the third electrode 34 to form a row of the third protrusions 20 disposed on the strip third electrode 34. Similarly, the first protrusions 16 have different potentials (polarities) from the second protrusions 18 since they are respectively connected to the electrodes of different potentials. For example, the first protrusions 16 are low potentials, and the second protrusions 18 are high potentials. Specifically, the first protrusions 16 with low potentials and the second protrusions 18 with high potentials are arranged in such a way that they alternate with one another. That is, one row of the first protrusions 16 with low potential, one row of the second protrusions 18 with high potential, another row of the first protrusions 16 with low potential, another row of the second protrusions 18 with high potential, and etc. are alternately arranged on the first electrodes 30 and the second electrodes 32 respectively.

In some embodiments, the device 14 includes a lateral power component, for example, a GaN active component. In some embodiments, the first electrodes 30 include source electrodes, the second electrodes 32 include drain electrodes, and the third electrode 34 includes a gate electrode.

In some embodiments, the first protrusions 16, the second protrusions 18 and the third protrusions 20 include copper, tin, gold, or a combination thereof. In this embodiment, the first protrusions 16, the second protrusions 18 and the third protrusions 20 include cylinders. In some embodiments, the first protrusions 16, the second protrusions 18 and the third protrusions 20 include other suitable shapes. More detailed dimensions of the components are disclosed in FIGS. 2-4. When the first protrusions 16, the second protrusions 18 and the third protrusions 20 include cylinders, the first protrusions 16, the second protrusions 18 and the third protrusions 20 have a diameter "D" which is at least 65 μm. The first protrusions 16 have a first spacing "S1" which is at least 40 μm. The second protrusions 18 have the same spacing as that of the first protrusions 16. Also, the third protrusions 20 have the same spacing as that of the first protrusions 16. The first spacing "S1" means the spacing between the protrusions with the same polarity disposed on the same electrode. The first spacing "S1" is smaller than or equal to the diameter "D" of the first protrusions 16, the second protrusions 18 and the third protrusions 20. In addition, the one of the first protrusions 16 and the one of the second protrusions 18 have a second spacing "S2" which is at least 65 μm. The second spacing "S2" means the spacing between the protrusions with different polarities disposed on different electrodes. The second spacing "S2" is greater than or equal to about 1.6 times the first spacing "S1". The leadframe 12 and the device 14 have a third spacing "H" which is at least 60 μm.

In FIG. 1, the device 14 is connected to the leadframe 12 through the first protrusions 16, the second protrusions 18 and the third protrusions 20. The conductive unit 22 includes a first portion contacted with the substrate 26 of the device 14, a second portion contacted with the leadframe 12, a topmost surface 22b and a bottommost surface 22a. The first portion of the conductive unit 22 is connected to the substrate 26 of the device 14 by a part of the bottommost surface 22a thereof. The second portion of the conductive unit 22 is connected to the leadframe 12 by a part of the bottommost surface 22a thereof to form a pin 23. In some embodiments, the conductive unit 22 includes multiple pins to connect to the leadframe 12. The encapsulation material 24 covers the device 14 and the leadframe 12. A part of the topmost surface 22b of the conductive unit 22 is exposed from the encapsulation material 24.

In some embodiments, the conductive unit 22 includes copper. In some embodiments, the conductive unit 22 includes a clip. In FIG. 1, the substrate 26 of the device 14 has a first surface area "A1", the part of the topmost surface 22b of the conductive unit 22 exposed from the encapsulation material 24 has a second surface area "A2", and the second surface area "A2" is greater than or equal to about 1.2 times the first surface area "A1". In accordance with the exploded view (as shown in FIG. 5) of the package structure 10, the dimensional relationship between the conductive unit 22 and the device 14 is more clearly revealed.

Other related components are disclosed in FIG. 3. The package structure 10 further includes an adhesive layer 36' disposed on the first protrusions 16, the second protrusions 18 and the third protrusions 20. In some embodiments, the adhesive layer 36' includes solder. The first protrusions 16, the second protrusions 18 and the third protrusions 20 are further connected to the leadframe 12 via a plurality of metal pads 36, as shown in FIGS. 1 and 4. In some embodiments, the metal pads 36 include copper, silver, gold, or tin. The metal pads 36 have a width "W" which is smaller than or equal to the diameter "D" of the first protrusions 16, the second protrusions 18 and the third protrusions 20, as shown in FIG. 4.

In FIG. 3, the package structure 10 further includes a patterned passivation layer 38 covering the active layer 28 and a part of the first electrodes 30, the second electrodes 32 and the third electrode 34. The package structure 10 further includes a patterned polymer layer 40 covering the patterned passivation layer 38 and a part of the first electrodes 30, the second electrodes 32 and the third electrode 34, exposing a plurality of openings 42. The package structure 10 further includes a plurality of metal layers 44 disposed on sidewalls and bottoms of the openings 42. In some embodiments, the metal layers 44 serve as an under bump metal (UBM) to facilitate the subsequent electroplating process of the first protrusions 16, the second protrusions 18 and the third protrusions 20. The first protrusions 16, the second protrusions 18 and the third protrusions 20 are connected to the first electrodes 30, the second electrodes 32 and the third electrode 34 through the metal layers 44.

In one embodiment of the present invention, the power component is disposed on the leadframe through the multiple protrusions (i.e. copper pillars) connecting to the source electrodes and the drain electrodes using a flip chip technology. The source electrodes (the first protrusions) with low potentials and the drain electrodes (the second protrusions) with high potentials are arranged in such a way that they alternate with one another. The spacing between the protrusions with different polarities disposed on different electrodes is greater than or equal to about 1.6 times the spacing between the protrusions with the same polarity disposed on the same electrode. The arrangement and dimensions of the components have the following advantages. A narrow spacing between the adjacent protrusions is obtained. The influence of parasitic inductance is reduced due to replacement of the conventional wire bonding connection. The breakdown voltage is improved due to increase in the distance (at least 60 μm or more) between the power component and the leadframe by the protrusions with a proper height. The package products have excellent reliability.

In the lateral power component where the source electrodes and the drain electrodes are on the same side of the semiconductor substrate, current flows from the high-potential drain electrodes to the low-potential source electrodes through the active layer without flowing through the semiconductor substrate which is capable of avoiding parasitic resistance and inductance produced by the semiconductor substrate while operating. Additionally, the conductive unit (i.e. clip) is extended from the semiconductor substrate to the leadframe, replacing conventional wire bonding requiring two wires extended from both ends of the semiconductor substrate to the leadframe, which is capable of effectively reducing the entire package size.

Furthermore, the package structure with the exposed conductive unit (i.e. the package structure with at least a portion of the conductive unit uncovered by the encapsulation material, for example, the surface area of the exposed side of the conductive unit is greater than or equal to about 1.2 times the back surface area of the substrate of the device) is capable of achieving a good bi-directional heat dissipation effect, and improving device performance.

While the invention has been described by way of example and in terms of the embodiments, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A package structure, comprising:
   a leadframe;
   a device comprising a substrate, an active layer disposed on the substrate, and a plurality of first electrodes and second electrodes and a third electrode disposed on the active layer, wherein the plurality of first electrodes have different potentials than the plurality of second electrodes, and the plurality of first electrodes and second electrodes are arranged in such a way that they alternate with one another;
   a plurality of first protrusions disposed on each of the plurality of first electrodes;
   a plurality of second protrusions disposed on each of the plurality of second electrodes, wherein the plurality of first protrusions and second protrusions are connected to the leadframe;
   a conductive unit having a first portion, a second portion and a topmost surface, wherein the first portion of the conductive unit is connected to the substrate of the device, and the second portion of the conductive unit is connected to the leadframe; and
   an encapsulation material covering the device and the leadframe, wherein a part of the topmost surface of the conductive unit is exposed from the encapsulation material.

2. The package structure as claimed in claim 1, wherein the device is a lateral power component.

3. The package structure as claimed in claim 1, wherein the plurality of first electrodes comprise source electrodes, the plurality of second electrodes comprise drain electrodes, and the third electrode comprises a gate electrode.

4. The package structure as claimed in claim 1, wherein the plurality of first protrusions and second protrusions are made of copper, tin, gold, or a combination thereof.

5. The package structure as claimed in claim 1, wherein the plurality of first protrusions and second protrusions have a diameter which is at least 65 µm.

6. The package structure as claimed in claim 5, wherein the plurality of first protrusions have a first spacing which is at least 40 µm.

7. The package structure as claimed in claim 6, wherein the plurality of second protrusions have the same spacing as that of the plurality of first protrusions.

8. The package structure as claimed in claim 6, wherein the first spacing is smaller than or equal to the diameter of the plurality of first protrusions and second protrusions.

9. The package structure as claimed in claim 6, wherein the first protrusion and the second protrusion have a second spacing which is at least 65 µm.

10. The package structure as claimed in claim 9, wherein the second spacing is greater than or equal to 1.6 times the first spacing.

11. The package structure as claimed in claim 5, further comprising a plurality of metal pads disposed between the leadframe and the plurality of first protrusions and second protrusions.

12. The package structure as claimed in claim 11, wherein the plurality of metal pads are made of copper, silver, gold, or tin or a combination thereof.

13. The package structure as claimed in claim 11, wherein the plurality of metal pads have a width which is smaller than or equal to the diameter of the plurality of first protrusions and second protrusions.

14. The package structure as claimed in claim 1, wherein the substrate of the device has a first surface area, the part of the topmost surface of the conductive unit exposed from the encapsulation material has a second surface area, and the second surface area is greater than or equal to 1.2 times the first surface area.

15. The package structure as claimed in claim 1, wherein the leadframe and the device have a third spacing which is at least 60 µm.

16. The package structure as claimed in claim 1, further comprising a patterned passivation layer covering the active layer and a part of the plurality of first electrodes and second electrodes.

17. The package structure as claimed in claim 16, further comprising a patterned polymer layer covering the patterned passivation layer and a part of the plurality of first electrodes and second electrodes, exposing a plurality of openings.

18. The package structure as claimed in claim 17, further comprising a plurality of metal layers disposed on sidewalls and bottoms of the plurality of openings.

19. The package structure as claimed in claim 18, wherein the plurality of first protrusions and second protrusions are connected to the plurality of first electrodes and second electrodes through the plurality of metal layers.

* * * * *